(12) United States Patent
Hoffnagle

(10) Patent No.: US 6,178,000 B1
(45) Date of Patent: *Jan. 23, 2001

(54) MONOLITHIC SYMMETRIC INTERFEROMETER FOR GENERATION OF VARIABLE-PERIODICITY PATTERNS FOR LITHOGRAPHY

(75) Inventor: John A. Hoffnagle, San Jose, CA (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/111,878

(22) Filed: Jul. 8, 1998

(51) Int. Cl.[7] .................................................. G01B 9/02
(52) U.S. Cl. .......................... 356/455; 356/495; 356/517
(58) Field of Search .................................. 356/351, 345, 356/363

(56) References Cited

U.S. PATENT DOCUMENTS

| | | |
|---|---|---|
| 4,653,855 | 3/1987 | Birnbach et al. . |
| 4,734,345 | 3/1988 | Nomura et al. . |
| 5,142,385 | 8/1992 | Anderson et al. . |
| 5,415,835 | 5/1995 | Brueck et al. . |
| 5,699,158 * | 12/1997 | Negishi ................................ 356/356 |

FOREIGN PATENT DOCUMENTS

WO 96/26468    8/1996    (WO) .

OTHER PUBLICATIONS

S.H. Zaidi et al., Multiple–exposure interferometer lithography, J. Vac. Sci. Technol. B 11(3), May/Jun. 1993, pp. 658–666.

X. Chen et al., Multiple exposure interferometric lithography—a novel approach to nanometer structures, CLEO'96, p. 390–391.

X. Chen et al., Interferometric lithography of sub–micrometer sparse hole arrays for field–emission display applications, J. Vac. Sci. Technol. B 14(5), Sep./Oct. 1996, pp. 3339–3349.

\* cited by examiner

*Primary Examiner*—Robert Kim
(74) *Attorney, Agent, or Firm*—Thomas R. Berthold, Esq.; Banner & Witcoff, Ltd.

(57) ABSTRACT

An interferometer device includes a first prism portion and a second prism portion. The first prism portion has a semi-transparent surface, a beam incident surface and a beam emerging surface. The beam incident surface receives an incident light beam at a wavelength of $\lambda$ and at an angle of incidence $\theta$ with respect to a normal to the beam incident surface. The second prism portion has a surface that corresponds to the semi-transparent surface of the first prism portion and a beam emerging surface that corresponds to the beam emerging surface of the first prism portion. The first and second prism portions are attached to each other at the semi-transparent surface of the first prism portion and the surface of the second prism portion corresponding to the semi-transparent surface. The semi-transparent surface splits the incident light beam into first and second light beams by reflecting the first beam at the semi-transparent surface and by passing the second light beam through the semi-transparent surface so that the second light beam enters the second prism portion. The first and second light beams are each respectively reflected internally to the first and second prism portions and emerge from the respective beam emerging surfaces of the first and second prism portions to form an interference pattern on a surface that has a periodicity $\Lambda$ that is a function of the angle of incidence $\theta$ of the incident light beam, with the ratio of $\Lambda:\lambda$ being greater than 2:1.

32 Claims, 3 Drawing Sheets

MONOLITHIC SYMMETRIC INTERFEROMETER FOR GENERATION OF VARIABLE-PERIODICITY PATTERNS FOR LITHOGRAPHY

BACKGROUND OF THE INVENTION

1. Field of the Invention

The present invention relates to the field of optical lithography. More particularly, the present invention relates to an apparatus and a method for producing an interference pattern having a variable periodicity.

2. Description of the Related Art

Optical lithography is used extensively in industry for translating variations in the intensity of a beam of light into chemical or mechanical features on the surface of a material object, such as for fabricating microscopic electronic circuits. The optical patterns used for fabricating the microscopic circuits are most commonly generated by lenses that produce a magnified image of an object bearing a pattern that is desired to be reproduced lithographically. This conventional approach, however, becomes increasingly difficult to implement as the desired features become finer.

An alternative approach for generating patterns is by using interferometric lithography, in which optical patterns are generated by constructive and destructive interference of optical fields of uniform beams of light. FIG. 1 shows the basic geometry for generating an interferometric pattern. Two light beams $k_1$ and $k_2$ having the same wavelength $\lambda$ and propagating in respectively different directions intersect at a surface S of a material object so that the normal n to surface S is coplanar with the respective directions of light beams $k_1$ and $k_2$ and makes an angle $\theta$ with each of light beams $k_1$ and $k_2$. Under these conditions, the optical intensity along surface S varies, or is modulated, sinusoidally with period $\Lambda$ as $$\Lambda = \lambda/2 \sin \theta. \tag{1}$$

For a fixed optical wavelength $\lambda$, $\Lambda$ can be adjusted to have any value greater than $\lambda/2$ by varying $\theta$ between 90° to 0°.

The periodic modulation of the optical intensity $\Lambda$ can be used for producing a periodic structure on surface S through well-known techniques of optical lithography. The ability to produce features as small as $\lambda/2$ is one of the principal attractions for interferometric lithography because patterns having small periodicity, i.e., small feature size, have significant technical importance, such as in the fabrication of electronic circuits. Patterns more complicated than a simple periodic structure can be generated, in principle, through multiple lithographic steps, such as disclosed by S. Zaidi et al., J. Vac. Sci. Tech. B11, p. 658, 1993, and by U.S. Pat. No. 5,415,835 to Brueck et al. Accordingly, each step of a multiple lithographic technique relies on the interference phenomenon shown in FIG. 1.

At the heart of any apparatus for interferometric lithography is an interferometer, that is, the device that generates two optical beams in the configuration shown by FIG. 1. A clear interference pattern can only arise when the interfering beams have a stable, well-defined phase. To achieve this, light beams $k_1$ and $k_2$ are derived from a single incoming beam by either a reflecting surface or a refracting surface of limited extent, or by a partially reflecting surface. A useful interferometer must satisfy the following requirements:

(1) The interferometer must be mechanically stable because fluctuations on the order of a fraction of an optical wavelength in the beam paths will degrade the interference pattern;

(2) The angle $\theta$ is desirably adjustable so that the period $\Lambda$ can be varied; and (3) The lengths of the optical paths traversed by beams $k_1$ and $k_2$ are desired to be equal so that a light source of limited coherence length can be used.

When the paths of beams $k_1$ and $k_2$ are related by reflection in a plane of symmetry, then condition (3) is met and, moreover, the phase difference of the interfering beams vanishes in the plane of symmetry. Thus, the plane of symmetry serves as a reference plane that allows the registration of multiple exposures, as is required to generate complex patterns using multiple lithographic techniques.

Interferometers can be classified into one of two types according to how the single incident beam is split into two interfering beams. The first type, referred to as "amplitude division" splits the incident beam by a partially reflecting surface. The second type, referred to as "wavefront division" splits the incident beam by two distinct surfaces that intercept different parts of the incident beam.

Variations of the Mach-Zehnder interferometer, in which adjustable mirrors are used to direct the resulting beams onto the surface S with the correct angles, belong to the first class of interferometers. Nevertheless, the mirrors introduce the potential for misalignment and instability, which is contrary to the first requirement listed above. A more recent variation, the achromatic grating interferometer disclosed by A. Yeh et al., Appl. Opt. 31, 4540, (1992), is stable and symmetric, but has no possibility for adjusting $\theta$.

In the second class of interferometers, that is, interferometers that rely on wavefront divisions, the incident beam is required to have a relatively large spatial extent, even though only a small region of the substrate is desired to be illuminated. Expanding the incident beam reduces the optical intensity, which is undesirable for lithography. The simple one-mirror Lloyd interferometer disclosed by S. Tolansky, An Introduction to Interferometry, Longmans, Green and Co., 1955, is adjustable and mechanically stable, but is highly asymmetric and requires that the incident beam have approximately the same dimension as the entire substrate, which may be much larger than the area that is to be illuminated. Lastly, the Fresnel biprism disclosed by S. Tolansky, supra, is symmetric, simple and mechanically stable, but in practice the biprism is not well-suited for generation of variable periodicity patterns, even though adjustment of $\theta$ is possible in principle.

What is needed is a mechanically stable, symmetric monolithic device that splits a beam of light into two beams that intersect at an adjustable angle $\theta$, thereby producing an interference pattern having a variable periodicity, while also providing equal length optical paths for the split beams so that a light source of short coherence length can be used.

SUMMARY OF THE INVENTION

The present invention provides a mechanically stable, symmetric monolithic device that splits a beam of light into two beams that intersect at an adjustable angle $\theta$, thereby producing an interference pattern having a variable periodicity, while also providing equal length optical paths for the split beams so that a light source of short coherence length can be used, such as most excimer lasers and lamps. Thus, the present the invention is useful in high-resolution interferometric lithography techniques when fabricating electronic devices.

The advantages of the present invention are provided by an interferometer device that includes a first prism portion and a second prism portion. The first prism portion has a semi-transparent surface, a beam incident surface and a beam emerging surface. Both the beam incident surface and the beam emerging surface are different from the semi-transparent surface. The beam incident surface receives an incident light beam having a wavelength of $\lambda$ at an angle of incidence $\theta$ with respect to a normal to the beam incident surface. The second prism portion has a surface that corresponds to the semi-transparent surface of the first prism portion and a beam emerging surface that corresponds to the beam emerging surface of the first prism portion. The first and second prism portions are attached to each other at the semi-transparent surface of the first prism portion and the surface of the second prism portion corresponding to the semi-transparent surface preferably by an optical cement. The semi-transparent surface of the first prism portion splits the incident light beam into first and second light beams by reflecting the first beam at the semi-transparent surface and by passing the second light beam through the semi-transparent surface so that the second light beam enters the second prism portion. The first light beam follows a first beam path through the first prism portion, while the second light beam follows a second beam path through the second prism portion. An optical phase difference between the first beam path and the second beam path is substantially equal to 0°. The first and second light beams respectively emerge from the beam emerging surfaces of the first and second prism portions to form an interference pattern on a surface. According to the invention, the interference pattern has a periodicity $\Lambda$ that is a function of the angle of incidence $\theta$ of the incident light beam, and the ratio of $\Lambda:\lambda$ is greater than 2:1.

Preferably, the first and second prism portions are identically shaped. In one specific embodiment of the present invention, at least one of the first and second prism portions has a rectangularly-shaped cross section, while in another specific embodiment at least one of the first and second prism portions has a trapezoidally-shaped cross section. In yet another embodiment, at least one of the first and second prism portions has a heptagonally-shaped cross section.

BRIEF DESCRIPTION OF THE DRAWING

The present invention is illustrated by way of example and is not limited by the accompanying figures in which like reference numerals indicate similar elements and in which.

DETAILED DESCRIPTION

The present invention provides a mechanically stable, symmetric monolithic device that splits a beam of light into two beams that intersect at an adjustable angle $\theta$, thereby producing an interference pattern having a variable periodicity, while also providing equal length optical paths for the split beams so that a light source of short coherence length can be used, such as most excimer lasers and lamps.

Figure 1:
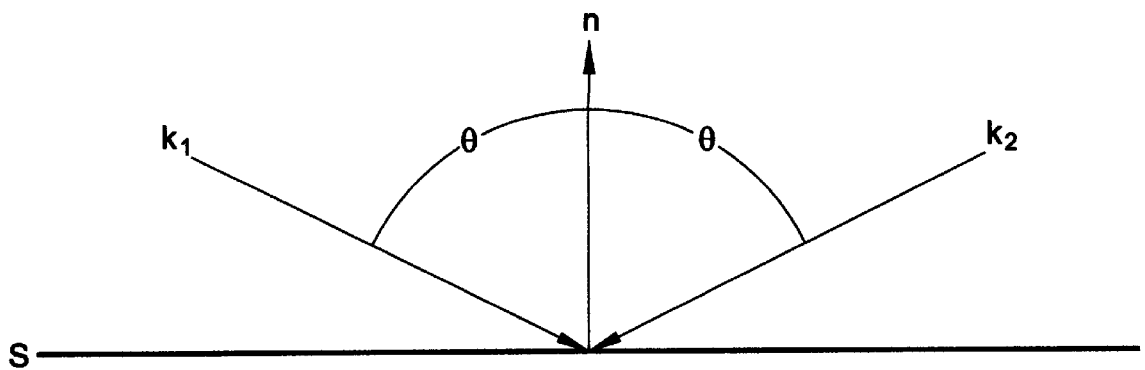
FIG. 1 shows a schematic diagram illustrating two-beam interference.

According to the invention, an interferometer is preferably constructed from two identical, transparent prism portions formed from a material, such as optical glass or fused silica, or a polymeric material such as acrylic. Two corresponding faces of the prism portions are rigidly attached to each other with, for example, optical cement or by optical contacting, to form a single, mechanically stable unit. The shared face is semi-transparent, and thus splits an incident light beam into two beams. The two split beams undergo symmetric reflection and refraction from the remaining faces of the interferometer prism portions, after which they emerge into free space in such a way as to intersect at an external surface S, as shown in FIG. 1. By adjusting the path of the incident beam, for example, by rotating or translating the entire interferometer device, the angle $\theta$ can be adjusted without compromising the symmetry and mechanical stability of the interferometer device. The pitch of the interference pattern can be changed by changing the angle of incidence $\theta$ of the incident light beam. By making the two split beams intersect at surface S with an increasingly oblique angle with surface S, the pitch of the interference pattern is made increasingly finer.

Figure 2C:
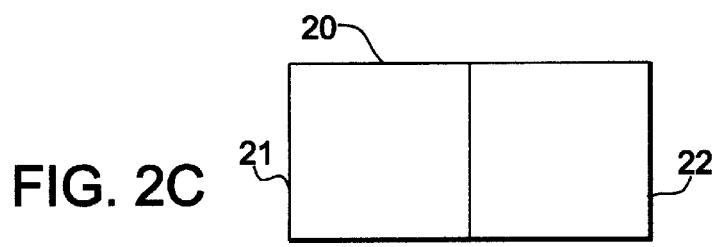
FIGS. 2A–2C show different views of a first embodiment of a monolithic interferometer device according to the present invention.
Figures 2A, 2B:
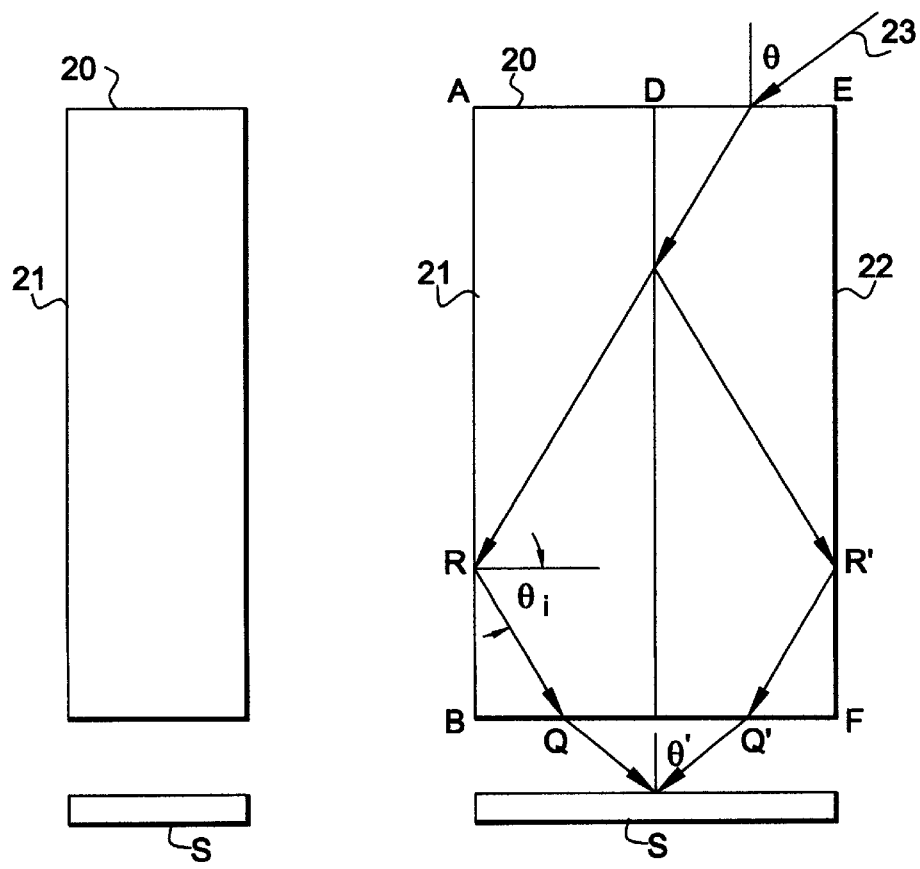

FIGS. 2A–2C show different views of a first embodiment 20 of a monolithic interferometer device according to the present invention. FIG. 2A shows a front view of interferometer device 20, while FIGS. 2B and 2C respectively show a side view and a top view of interferometer device 20. Interferometer device 20 includes two identical prism portions 21 and 22 that are each made of transparent material and each have the shape of a rectangular parallelpiped. Lines with arrows in FIGS. 2–4 indicate a typical optical path through an interferometer according to the present invention. In FIG. 2A, prism portions 21 and 22 are further identified by ABCD and EFCD, respectively. Prism portions 21 and 22 are attached along semitransparent face CD by applying a suitable coating to one of the prisms in a well-known manner before assembly, or by arranging a suitable gap between the prisms.

A beam of light 23 enters interferometer device 20 through face DE at a point P and at an angle equal to $\theta$ with respect to the normal to face DE. At face CD, light beam 23 is split into beams 24 and 25. Beams 24 and 25 are reflected by a suitable coating or by total internal reflection at points R and R' on the faces AB and EF, respectively. Beams 24 and 25 are then refracted at faces BC and CF, where they respectively emerge at points Q and Q' and converge on a surface S in the manner shown by FIG. 1.

The optical paths of beams 24 and 25 are inherently symmetric. Consequently, varying the angle of incidence θ of incoming beam 23 causes an equal variation of an interference angle θ', and a corresponding variation of the periodicity of the interference pattern according to Eq. (1). For the geometry of interferometer 20, the range over which θ can be adjusted can be readily determined. Let $θ_i$ be the angle of the internal ray RQ with respect to the normal to face AB. If the index of refraction of the prism material is n, then θ and $θ_i$ are related by $$\sin θ = n \cos θ_i. \quad (2)$$

Let l denote the length of each of faces AB, CD and EF. Let a denote the length of each of faces AD, BC, DE and CF. Let b denote the distance QC, and let c denote the distance DP. The following identity holds, $$l = (2a + c - b)\tan θ_i. \quad (3)$$

Distances b and c both range from 0 to a. Defining $$x = b/a, \quad (4)$$

$$y = c/a, \quad (5)$$

Eq.(3) can be rewritten as $$l/a = (2 + y - x)\tan θ_i. \quad (6)$$

Both 0<x<1 and 0<y<1, so the range of $θ_i$ is given by $$\arctan\left(\frac{l}{3a}\right) < θ_i < \arctan\left(\frac{l}{a}\right). \quad (7)$$

The corresponding range of θ and Λ can be computed by applying Eqs. (7), (2) and (1). The minimum and maximum values of $θ_i$, θ, and Λ/λ are shown in Table 1 for n=1.5. Table 1 shows that it is possible to vary the value of Λ by more than a factor of 2.

TABLE 1

| | $θ_i$ | | θ | | Λ/λ | | |
|---|---|---|---|---|---|---|---|
| l/a | min | max | min | max | min | max | ratio |
| 3.00 | 45.0 | 71.6 | 28.3 | 90.0 | 0.50 | 1.05 | 2.11 |
| 3.20 | 46.8 | 72.6 | 26.6 | 90.0 | 0.50 | 1.12 | 2.24 |
| 3.40 | 48.6 | 73.6 | 25.0 | 82.9 | 0.50 | 1.18 | 2.34 |
| 3.60 | 50.2 | 74.5 | 23.7 | 73.8 | 0.52 | 1.25 | 2.39 |
| 3.80 | 51.7 | 75.3 | 22.4 | 68.4 | 0.54 | 1.31 | 2.43 |
| 4.00 | 53.1 | 76.0 | 21.3 | 64.2 | 0.56 | 1.37 | 2.47 |
| 4.20 | 54.5 | 76.6 | 20.3 | 60.7 | 0.57 | 1.44 | 2.51 |
| 4.40 | 55.7 | 77.2 | 19.4 | 57.7 | 0.59 | 1.50 | 2.54 |
| 4.60 | 56.9 | 77.7 | 18.6 | 55.0 | 0.61 | 1.57 | 2.57 |
| 4.80 | 58.0 | 78.2 | 17.8 | 52.7 | 0.63 | 1.63 | 2.60 |
| 5.00 | 59.0 | 78.7 | 17.1 | 50.5 | 0.65 | 1.70 | 2.62 |
| 5.20 | 60.0 | 79.1 | 16.5 | 48.6 | 0.67 | 1.77 | 2.65 |
| 5.40 | 60.9 | 79.5 | 15.9 | 46.8 | 0.69 | 1.83 | 2.67 |
| 5.60 | 61.8 | 79.9 | 15.3 | 45.1 | 0.71 | 1.90 | 2.69 |
| 5.80 | 62.7 | 80.2 | 14.8 | 43.6 | 0.73 | 1.96 | 2.70 |
| 6.00 | 63.4 | 80.5 | 14.3 | 42.1 | 0.75 | 2.03 | 2.72 |

According to the invention, it is not required that the first and second prism portions are identically shaped as long as the optical phase difference between the light path in each respective prism portion is substantially equal to 0°. Preferably, though, identically-shaped prism portions are easier to fabricate.

Figure 3C:
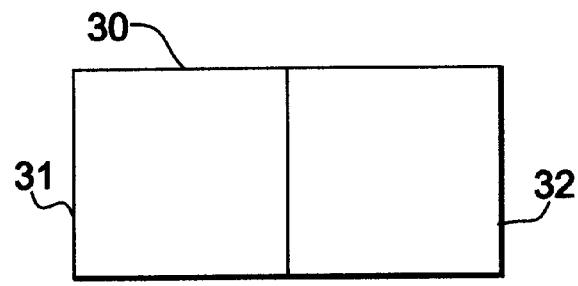
FIGS. 3A–3C show different views of a second embodiment of a monolithic interferometer device according to the present invention.
Figure 3B:
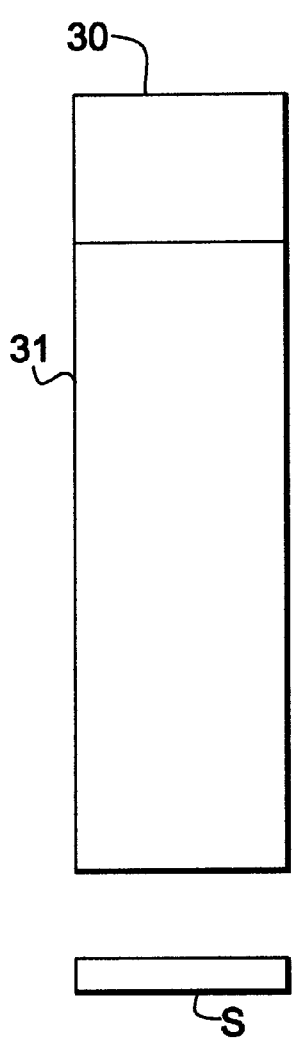
Figure 3A:
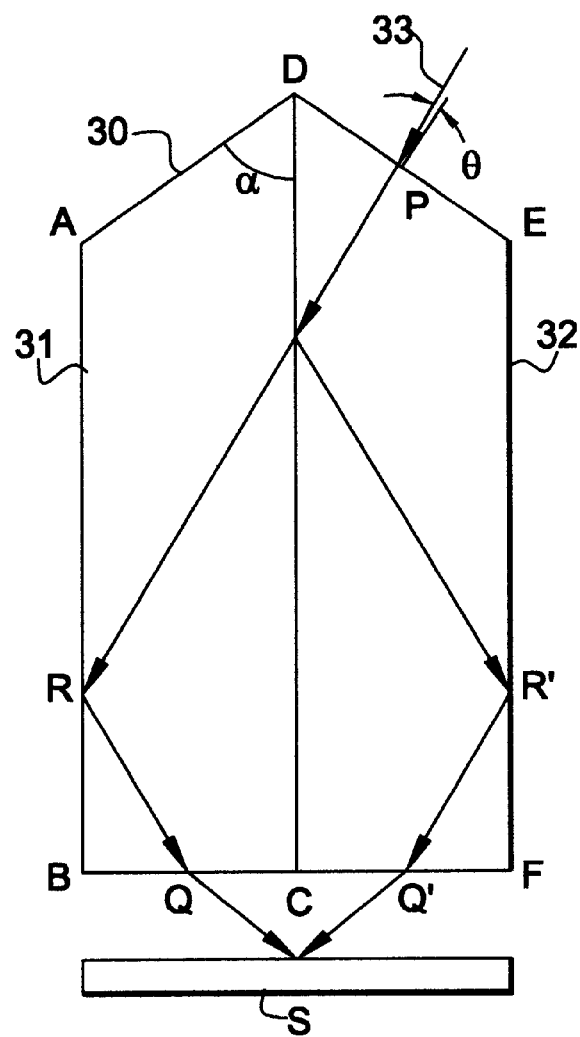

Further, it is not necessary to use rectangularly-shaped prism portions. In fact, there are advantages in departing from the purely right-angle geometry shown in FIG. 2. A second exemplary embodiment of an interferometer device 30 according to the present invention is shown in FIGS. 3A–3C. Interferometer device 30 differs from interferometer device 20 by having trapezoidally-shaped prism portions 31 and 32, as shown in FIG. 3A. In FIG. 3A, prism portions 31 and 32 are further identified by ABCD and EFCD, respectively. Prism portions 31 and 32 are attached along semi-transparent face CD by applying a suitable coating to one of the prism portions in a well-known manner before assembly, or by arranging a suitable gap between the prism portions. In FIG. 3A, faces AD and DE each form an angle α with face DC that reduces the angle of incidence of an incoming beam 33 on face DE. The geometry of interferometer device 30 allows the angle of incidence θ to be varied over a slightly larger range associated with the embodiment of FIG. 2.

Additionally, the angle of incidence θ of incoming ray 33 on face DE is more nearly normal, which facilitates application of an anti-reflection coating to face DE. Calculation of the adjustment range of θ is analogous to the embodiment of FIG. 2. Let l denote the length of face CD. Let a denote the length of each of faces BC and CF. Let b denote distance QC, and let c denote the projection of distance DP onto face CF. Defining x and y as in Eqs. (5), the identity analogous to Eq. (6) is $$l/a = (2 + y - x)\tan θ_i + y \cot α. \quad (8)$$

In this case, the range of $θ_i$ is given by $$\arctan\left(\frac{1}{3}[l/a - \cot α]\right) < θ_i < \arctan\left(\frac{l}{a}\right). \quad (9)$$

Table 2 summarizes the results for Eqs. (9), (2) and (1) for the case of α=45° and n=1.5, showing that Λ can vary over a range having a factor of about 3.

TABLE 2

| | $θ_i$ | | θ | | Λ/λ | | |
|---|---|---|---|---|---|---|---|
| l/a | min | max | min | max | min | max | ratio |
| 4.40 | 48.6 | 77.2 | 19.4 | 82.0 | 0.50 | 1.50 | 2.99 |
| 4.60 | 50.2 | 77.7 | 18.6 | 73.8 | 0.52 | 1.57 | 3.01 |
| 4.80 | 51.7 | 78.2 | 17.8 | 68.4 | 0.54 | 1.63 | 3.04 |
| 5.00 | 53.1 | 78.7 | 17.1 | 64.2 | 0.56 | 1.70 | 3.06 |
| 5.20 | 54.5 | 79.1 | 16.5 | 60.7 | 0.57 | 1.77 | 3.08 |
| 5.40 | 55.7 | 79.5 | 15.9 | 57.7 | 0.59 | 1.83 | 3.09 |
| 5.60 | 56.9 | 79.9 | 15.3 | 55.0 | 0.61 | 1.90 | 3.11 |
| 5.80 | 58.0 | 80.2 | 14.8 | 52.7 | 0.63 | 1.96 | 3.12 |
| 6.00 | 59.9 | 80.5 | 14.3 | 50.5 | 0.65 | 2.03 | 3.13 |

Figure 4:
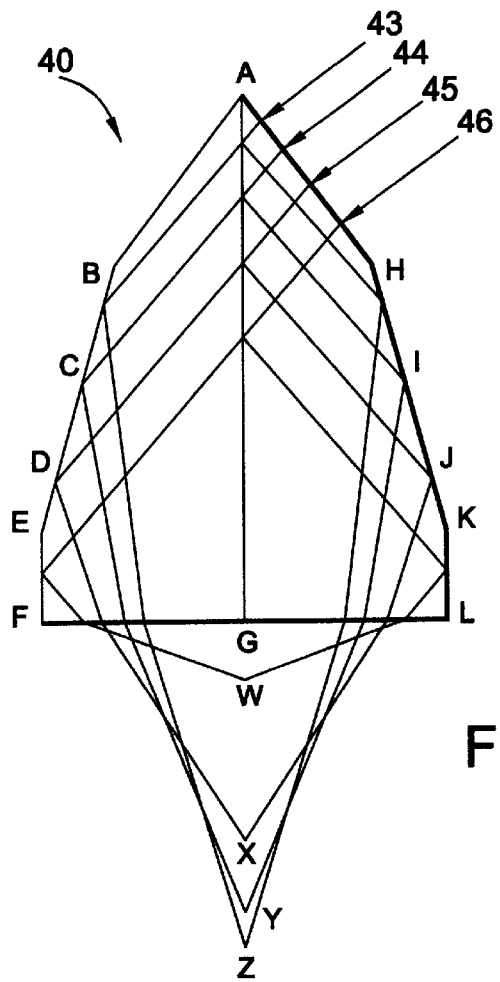
FIG. 4 shows a third embodiment of a monolithic interferometer device according to the present invention.

FIG. 4 shows a third embodiment of a monolithic interferometer device 40 according to the present invention. Interferometer device 40 includes prism portions 41 and 42 that each have a heptagonally-shaped, as viewed in FIG. 4. In FIG. 4, prism portions 41 and 42 are also identified by ABCDEFG and AGHIJKL, respectively. An incident light beam enters interferometer device 40 through face AH of prism portion 42 and is split at face AG. Each resulting beam exits interferometer device 40 through faces FG and GL of prism portions 41 and 42, respectively. In this particular implementation, the angles of faces BC, CD, DE, EF, HI, IJ, JK and KL have been chosen so that the periodicities of the interference patterns generated by incident light beams 43–46 are in the integral ratios 1:2:3:4 so that the geometry of interferometer device 40 generates a larger range of periodicities than the embodiments of the present invention shown in FIGS. 2 and 3. While the embodiment of FIG. 4 does not allow continuous tuning of the periodicity over the entire range, the point at which the light beam is incident to interferometer device 40 can be selected for varying the periodicity of the resulting interference pattern. Additionally, while each of the intersection points W–Z corresponding to incident light beams 43–46, respectively, are shown to be at different locations, the angles of faces BC, CD, DE, EF, HI, IJ, JK and KL can be chosen so that the point of intersection for each incident light beam is at the same location.

Figure 5:
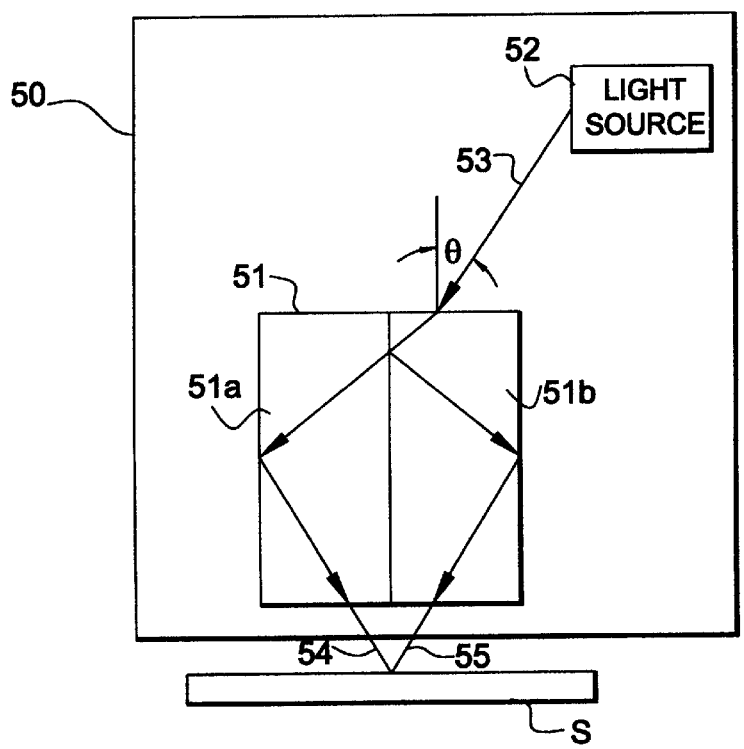
FIG. 5 shows an exemplary configuration of an interferometer apparatus incorporating a symmetric interferometer device of the present invention.

FIG. 5 shows an exemplary configuration of an interferometer apparatus 50 incorporating the symmetric interferometer device 51 of the present invention. Interferometer apparatus 50 includes a light source 52 that projects a light beam 53 that is incident upon interferometer device 51 at an angle of incidence θ. Interferometer device 51 includes first and second prism portions 51a and 51b, and thereby splits light beam 53 into first and second light beams 54 and 55. The resulting light beams 54 and 55 are directed to surface S to form a pattern having a periodicity Λ that is related to θ.

While the present invention has been described in connection with the illustrated embodiments, it will be appreciated and understood that modifications may be made without departing from the true spirit and scope of the invention.

What is claimed is:

1. An interferometer, comprising:
   a first prism portion having a semi-transparent surface, a beam incident surface receiving an incident light beam at a selected point of incidence on the beam incident surface, a surface having a plurality of faces, and a beam emerging surface, the beam incident surface, the surface having the plurality of faces and the beam emerging surface each being different from the semi-transparent surface, and the incident light beam having a wavelength of λ; and
   a second prism portion having a surface corresponding to the semi-transparent surface of the first prism portion, a surface having a plurality of faces corresponding to the surface having the plurality of faces of the first prism portion, and a beam emerging surface corresponding to the beam emerging surface of the first prism portion,
   the first and second prism portions being disposed with respect to each other so that the semi-transparent surface of the first prism portion and the surface of the second prism portion corresponding to the semi-transparent surface is between the first and second prism portions, and
   the semi-transparent surface of the first prism portion splitting the incident light beam into first and second light beams, the first light beam being reflected at the semi-transparent surface and the second light beam passing through the semi-transparent surface and entering the second prism portion, the first light beam following a first beam path through the first prism portion to a selected face of the surface having the plurality of faces, the selected face corresponding to the selected point of incidence on the beam incident surface, the second light beam following a second beam path through the second prism portion corresponding to the first beam path, the first and second light beams respectively emerging from the beam emerging surfaces of the first and second prism portions to form an interference pattern on a surface, the interference pattern having a variable periodicity Λ that is a function of the selected point of incidence of the incident light beam on the beam incident surface and the selected face of the surface having the plurality of faces.

2. The interferometer according to claim 1, wherein an optical phase difference between the first beam path and the second beam path is substantially equal to 0°.

3. The interferometer according to claim 1, wherein a ratio of Λ:λ is greater than 2:1.

4. The interferometer according to claim 1, wherein a ratio of Λ:λ is greater than 3:1.

5. The interferometer according to claim 1, wherein a ratio of Λ:λ is greater than 4:1.

6. The interferometer according to claim 1, wherein the first and second prism portions are attached to each other at the semi-transparent surface of the first prism portion and the surface corresponding to the semi-transparent surface of the second prism portion.

7. The interferometer according to claim 1, wherein the first and second prism portions are identically shaped.

8. The interferometer according to claim 1, wherein at least one of the first and second prism portions has a heptagonally-shaped cross section.

9. The interferometer according to claim 1, wherein the first and second prism portions are attached to each other by an optical cement.

10. The interferometer according to claim 1, wherein the first and second prism portions are attached to each other by optical contacting.

11. An interferometer apparatus, comprising:
    a light source generating a light beam; and
    an interferometer device upon which the light beam is incident, the interferometer device including,
    a first prism portion having a semi-transparent surface, a beam incident surface receiving the incident light beam at a selected point of incidence on the beam incident surface, a surface having a plurality of faces and a beam emerging surface, the beam incident surface, the surface having the plurality of faces and the beam emerging surface each being different from the semi-transparent surface, and the incident light beam having a wavelength of λ, and
    a second prism portion having a surface corresponding to the semi-transparent surface of the first prism portion, a surface having a plurality of faces corresponding to the surface having the plurality of faces of the first prism portion, and a beam emerging surface corresponding to the beam emerging surface of the first prism portion, the first and second prism portions being disposed with respect to each other so that the semi-transparent surface of the first prism portion and the surface of the second prism portion corresponding to the semi-transparent surface is between the first and second prism portions, and the semi-transparent surface of the first prism portion splitting the incident light beam into first and second light beams, the first light beam being reflected at the semi-transparent surface and the second light beam passing through the semi-transparent surface and entering the second prism portion, the first light beam following a first beam path through the first prism portion to a selected face of the surface having the plurality of faces, the selected face corresponding to the selected point of incidence on the beam incident surface, the second light beam following a second beam path through the second prism portion corresponding to the first beam path, the first and second light beams respectively emerging from the beam emerging surfaces of the first and second prism portions to form an interference pattern on a surface, the interference pattern having a variable periodicity $\Lambda$ that is a function of the selected point of incidence of the incident light beam on the beam incident surface and the selected face of the surface having the plurality of faces.

12. The interferometer apparatus according to claim 11, wherein an optical phase difference between the first beam path and the second beam path is substantially equal to 0°.

13. The interferometer apparatus according to claim 11, wherein a ratio of $\Lambda:\lambda$ is greater than 2:1.

14. The interferometer apparatus according to claim 11, wherein a ratio of $\Lambda:\lambda$ is greater than 3:1.

15. The interferometer apparatus according to claim 11, wherein a ratio of $\Lambda:\lambda$ is greater than 4:1.

16. The interferometer apparatus according to claim 11, wherein the first and second prism portions are attached to each other at the semi-transparent surface of the first prism portion and the surface corresponding to the semi-transparent surface of the second prism portion.

17. The interferometer apparatus according to claim 11, wherein the first and second prism portions are identically shaped.

18. The interferometer apparatus according to claim 11, wherein at least one of the first and second prism portions has a heptagonally-shaped cross section.

19. The interferometer apparatus according to claim 11, wherein the first and second prism portions are attached to each other by an optical cement.

20. The interferometer apparatus according to claim 11, wherein the first and second prism portions are attached to each other by optical contacting.

21. A method for generating a interferometric pattern, the method comprising the steps of:

receiving an incident light beam at a beam incident surface of an interferometer device at a selected point of incidence on the beam incident surface, the incident light beam having a wavelength of $\lambda$, the interferometer device including, a first prism portion having a semi-transparent surface, the beam incident surface and a surface having a plurality of faces, the beam incident surface and the surface having the plurality of faces each being is different from the semi-transparent surface; and a second prism portion having a surface corresponding to the semi-transparent surface of the first prism portion and a surface having a plurality of faces corresponding to the surface having the plurality of faces of the first prism portion, the first and second prism portions being disposed with respect to each other so that the semi-transparent surface of the first prism portion and the surface of the second prism portion corresponding to the semi-transparent surface is between the first and second prism portions, splitting the incident light beam into first and second light beams at the semi-transparent surface of the first prism portion by reflecting the first light beam at the semi-transparent surface and by passing the second light beam through the semi-transparent surface of the first prism portion;

passing each of the first and second light beams along first and second light paths, the first and second light paths respectively being internal to the first and second prism portions, the first light beam following a first beam path through the first prism portion to a selected face of the surface having the plurality of faces, the selected face corresponding to the selected point of incidence on the beam incident surface, the second light beam following a second beam path through the second prism portion corresponding to the first beam path; and directing the first and second light beams to a surface external to the interferometer device for generating an interference pattern having a variable periodicity $\Lambda$ that is a function of the selected point of incidence of the incident light beam at the beam incident surface and the selected face of the surface having the plurality of faces.

22. The method according to claim 21, wherein an optical phase difference between the first beam path and the second beam path is substantially equal to 0°.

23. The method according to claim 21, wherein the step of passing each of the first and second light beams along first and second paths includes the step of reflecting each of the first and second light beams respectively internally within the first and second prism portions.

24. The method according to claim 21, wherein the first prism portion includes a beam emerging surface and the second prism portion includes a beam emerging surface corresponding to the beam emerging surface of the first prism portion, and wherein the step of directing the first and second light beams to the surface external to the interferometer device includes the step of passing the first and second light beams through the respective beam emerging surfaces of the first and second prism portions.

25. The method according to claim 21, wherein a ratio of $\Lambda:\lambda$ is greater than 2:1.

26. The method according to claim 21, wherein a ratio of $\Lambda:\lambda$ is greater than 3:1.

27. The method according to claim 21, wherein a ratio of $\Lambda:\lambda$ is greater than 4:1.

28. The method according to claim 21, wherein the first and second prism portions are attached to each other at the semi-transparent surface of the first prism portion and the surface corresponding to the semi-transparent surface of the second prism portion.

29. The method according to claim 21, wherein the first and second prism portions are identically shaped.

30. The method according to claim 21, wherein at least one of the first and second prism portions has a heptagonally-shaped cross section.

31. The method according to claim 21, wherein the first and second prism portions are attached to each other by an optical cement.

32. The method according to claim 21, wherein the first and second prism portions are attached to each other by optical contacting.

* * * * *